(12) United States Patent
Jen et al.

(10) Patent No.: US 6,281,063 B1
(45) Date of Patent: Aug. 28, 2001

(54) METHOD FOR MANUFACTURING TRENCH ISOLATION

(75) Inventors: Yi-Min Jen, Pan-Chiao; Kuan-Te Pai, Tao-Yuan, both of (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/690,519

(22) Filed: Oct. 17, 2000

(51) Int. Cl.$^7$ .............................................. H01L 21/8238
(52) U.S. Cl. ............................................. 438/221; 438/424
(58) Field of Search .................................. 438/221, 424, 438/425, 426, 431, 452, 697, 706, 723, 724, 756, 757

(56) References Cited

U.S. PATENT DOCUMENTS

| | | | |
|---|---|---|---|
| 5,223,736 | * 6/1993 | Rodder | 257/506 |
| 5,468,676 | * 11/1995 | Madan | 437/70 |
| 6,033,969 | * 3/2000 | Yoo et al. | 438/425 |

* cited by examiner

Primary Examiner—David Nelms
Assistant Examiner—Quoc Hoang (57) ABSTRACT

A method for manufacturing a trench isolation in a semiconductor device is disclosed, wherein a silicon nitride layer used as an anti-diffusion layer mask that defines an isolation region on a silicon substrate and a thermal oxidation process that is performed on active regions are previously used. A silicon substrate having a first pad oxide layer and a first silicon nitride layer formed thereon is first provided. Then the first pad oxide layer and the first silicon nitride layer are patterned to form an anti-diffusion layer mask and to expose an active region of the silicon substrate. Next the silicon substrate is oxidized to form a first silicon dioxide layer, wherein lateral oxidation on the active region of the silicon substrate underneath the first pad oxide layer and the first silicon nitride layer provides an edge of the first silicon dioxide layer in the shape of a bird's beak. Moreover, the first silicon nitride layer, the first pad oxide layer and the first silicon dioxide layer are removed to expose the silicon substrate. Furthermore, a second pad oxide layer is formed on the substrate and a second silicon nitride layer is deposited thereon. Finally, an isolation trench of the invention can be formed by using a conventional method.

28 Claims, 6 Drawing Sheets

METHOD FOR MANUFACTURING TRENCH ISOLATION

BACKGROUND OF THE INVENTION

1. Field of the Invention

The present invention relates to a method for manufacturing an isolation region and more particularly to a method for manufacturing a trench isolation in a semiconductor device.

2. Description of the Related Art

As the density of integrated circuits increases, the dimension of an isolation region between active regions in semiconductor devices decrease. With this trend, the conventional local oxidation of silicon (LOCOS) method for isolating active regions, which forms a field oxide layer by using a thermal oxidation technique, confronts the limit in the effective isolation length, thereby degrading characteristics of the isolation region. Furthermore, the conventional LOCOS method possesses some inherent drawbacks resulting from the processes, i.e., lateral oxidation of the silicon underneath the silicon nitride mask, making the edge of the field oxide resemble the shape of a bird's beak.

According to the disadvantages for LOCOS isolation structures mentioned above, an isolation technique using trenches has been developed. Generally, the trench isolation includes the steps of etching a silicon substrate to form a trench, depositing an oxide layer by using a chemical vapor deposition (CVD) process to fill up the trench, providing the oxide layer with a planarized surface using a chemical mechanical polish (CMP) process, and removing the oxide layer upon the active regions.

According to this technique, the semiconductor substrate is etched at a predetermined depth, thereby providing excellent characteristics of the device isolation. Furthermore, the field oxide layer is formed using a CVD technique, so that the device isolation region that is defined by a photolithography process can be maintained throughout.

Figure 1:
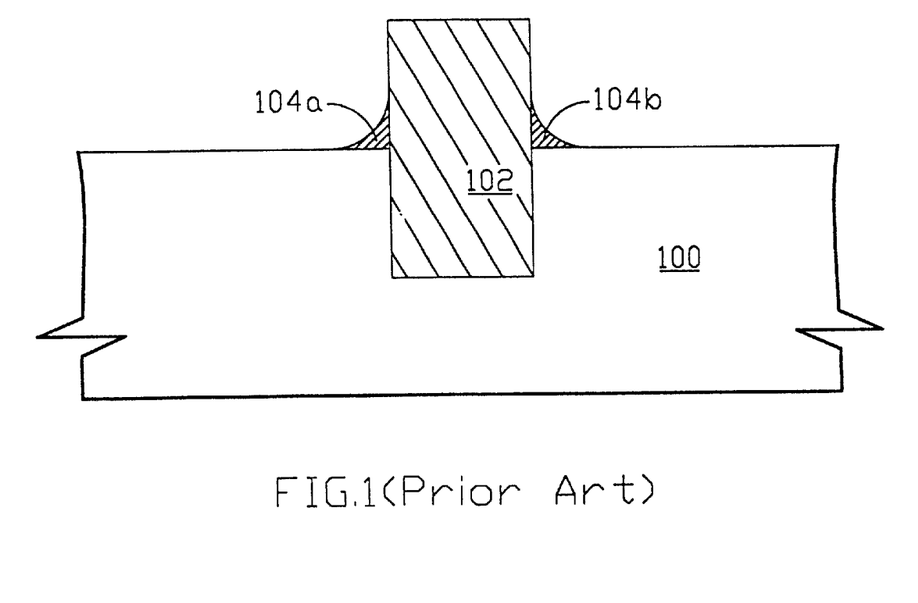
FIG. 1 is a schematic cross-sectional diagram of a conventional trench isolation, wherein the residual polysilicon are formed in the sharp corner of the interconnection between the surface of the diffusion layer and the conventional trench isolation structure.

However, the trench isolation technique described above has some drawbacks. For example, as shown in FIG. 1, a conventional trench isolation structure is illustrated. Residual polysilicon 104a, 104b are formed on the sharp corners of the interconnection between the trench isolation 102 and the surface of the silicon substrate 100. The residual polysilicon 104a, 104b are usually formed in the deposition and etching processes of the polysilicon used as gate electrodes. They may conduct neighboring gate electrodes and cause various problems of short circuit. It is therefore desirable in the art to provide a method for manufacturing trench isolation structures without the problems mentioned above. It is towards those goals that the present invention is specifically directed.

SUMMARY OF THE INVENTION

It is therefore an object of the invention to avoid the sharp corner of the interconnection between the diffusion layer and the conventional trench isolation structure. Alternatively, the invention prevents the residual polysilicon in the sharp corner formed in the etching process of the polysilicon used as gate electrodes in metal oxide semiconductor field effect transistors.

It is another object of this invention that the difficulty of the etching process of the polysilicon used as gate electrodes in metal oxide semiconductor field effect transistors can be reduced in spite of the shrinking of the design rule.

It is a further object of this invention that the problem of the short circuit of the gate electrodes, which is caused by the residual polysilicon in the sharp corners of the interconnections between the diffusion layers and the trench isolation, can be avoided.

To achieve these objects, and in accordance with the purpose of the invention, a silicon nitride layer used as an anti-diffusion layer mask that defines an isolation region on a silicon substrate and a thermal oxidation process that is performed on an active region are previously used before performing a conventional manufacturing process of a trench isolation. A silicon substrate having a first pad oxide layer and a first silicon nitride layer formed thereon is first provided. Then the first pad oxide layer and the first silicon nitride layer are patterned to form an anti-diffusion layer mask and to expose an active region of the silicon substrate. Next the silicon substrate is oxidized to form a first silicon dioxide layer, wherein lateral oxidation on the active region of the silicon substrate underneath the first pad oxide layer, the first silicon nitride layer provides an edge of the first silicon dioxide layer in the shape of a bird's beak. Moreover, the first silicon nitride layer, the first pad oxide layer and the first silicon dioxide are removed to expose the silicon substrate. Furthermore, a second pad oxide layer is formed on the substrate and a second silicon nitride layer is deposited thereon. Finally, an isolation trench of the invention can be formed by using a conventional method.

It is to be understood that both the foregoing general description and the following detailed description are exemplary and explanatory only and are not restrictive of the invention, as claimed.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The invention uses a silicon nitride layer as an anti-diffusion layer mask that defines an isolation region on a silicon substrate and a thermal oxidation process that is performed on an active region to avoid the sharp corner of the interconnection between the diffusion layer and the conventional trench isolation structure. In other words, the invention prevents the residual polysilicon in the sharp corner of the interconnection between the diffusion layer and the conventional trench isolation structure from being formed.

Figure 2:
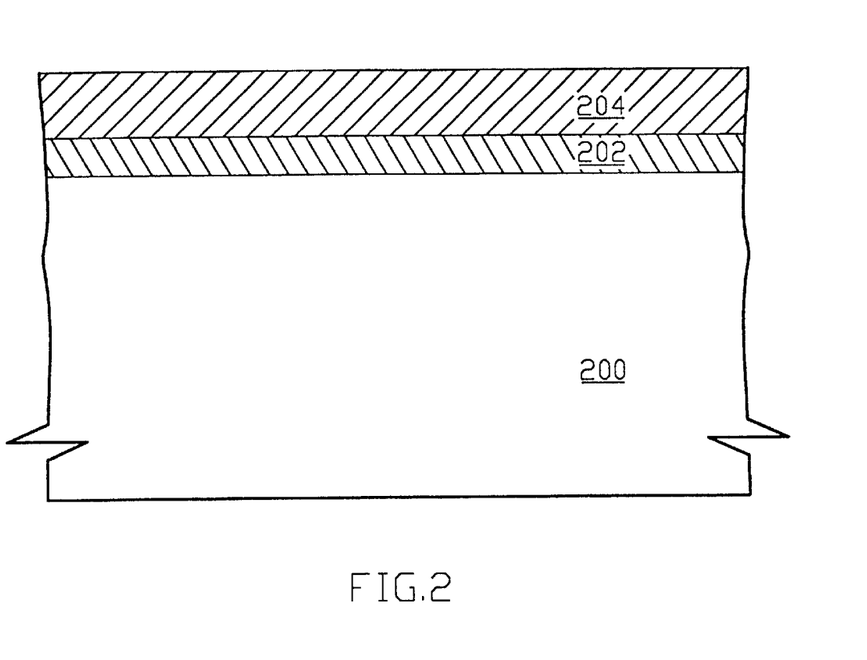
FIG. 2 is a schematic cross-sectional diagram of a silicon substrate wherein a first pad oxide layer is formed on the silicon substrate and then a first silicon nitride layer is formed thereon.

Referring to FIG. 2, a silicon substrate 200 having a pad oxide layer 202 and a silicon nitride layer 204 thereon is shown. The silicon substrate 200 can be a conventional silicon substrate, for example, a P-type silicon substrate with a <100> crystallographic orientation. The pad oxide layer 202 can be formed using a conventional thermal wet oxidation process on the silicon substrate 200. The thickness of the pad oxide layer 202 is about 100 to 500 angstroms, and the temperature of the thermal wet oxidation process is about 950° C. to about 1100° C. The silicon nitride layer 204 is deposited using a conventional chemical vapor deposition process, and preferably a low pressure chemical vapor deposition process. The thickness of the silicon nitride layer 204 is about 1000 to 2000 angstroms. The precursors of the low pressure chemical vapor deposition process are dichlorosilane ($SiCl_2H_2$), ammonia ($NH_3$) and the reacting temperature is from about 650° C. to about 800° C.

Figure 3:
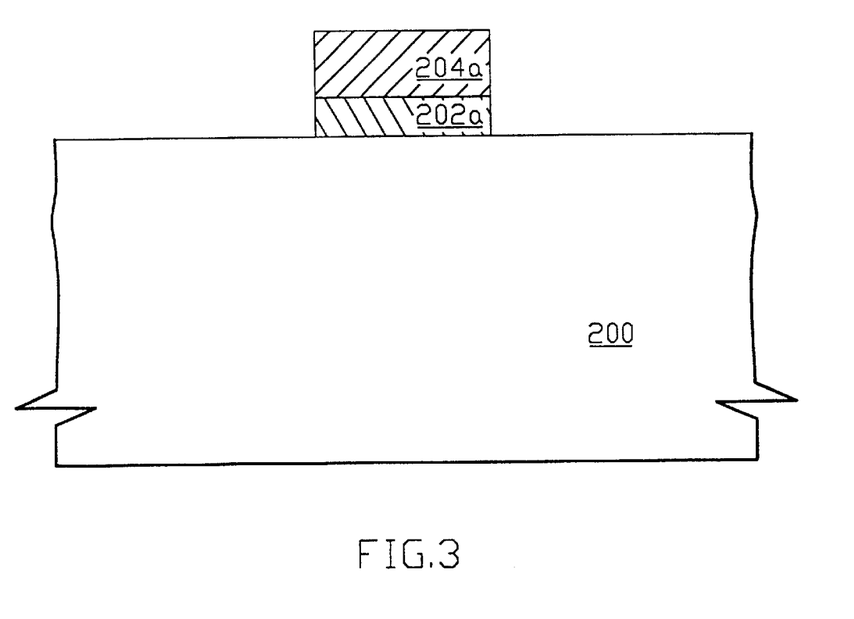
FIG. 3 shows a result of etching the first silicon nitride layer, the first pad oxide layer to expose active regions of the silicon substrate.

Referring to FIG. 3, an anti-diffusion layer mask consisting of a silicon nitride layer 204a and a pad oxide layer 202a is formed on the silicon substrate 200 by patterning to etch the silicon nitride layer 204 and the pad oxide layer 202. Moreover, isolation regions of the silicon substrate 200 are also defined. The patterning process can be a conventional lithography process and the etching process can be a conventional etching process, and preferably a dry etching process. The dry etching process can be a reactive ion etching process that uses carbon tetrafluoride ($CF_4$) plasma and a radio frequency of 13.56 MHz.

Figure 4:
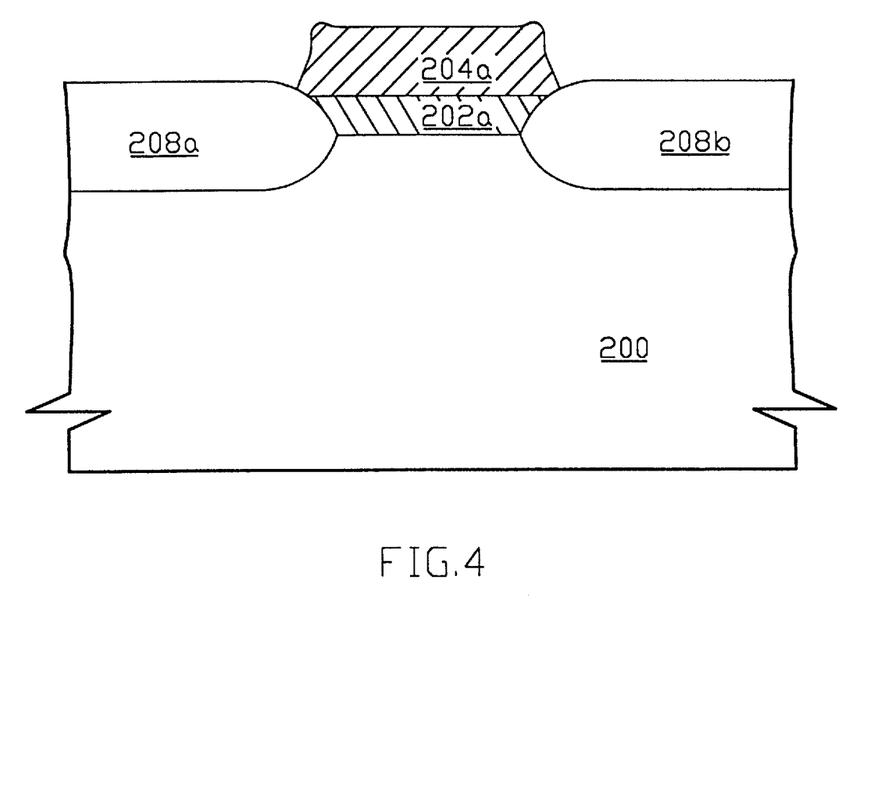
FIG. 4 shows a result of oxidizing the silicon substrate to form a first silicon dioxide layer, wherein lateral oxidation on the active regions of the silicon substrate underneath the first the oxide layer, the first silicon nitride layer provides an edge of the first silicon dioxide layer a shape of a bird's beak.

Referring to FIG. 4, the silicon substrate 200 is oxidized by using a conventional oxidation process to form silicon dioxide layers 208a, 208b on the active regions. Furthermore, the lateral oxidation on the active regions of the silicon substrate 200 underneath the silicon nitride 204a layer, the pad oxide layer 202a provides an edge of the silicon dioxide layers 208a, 208b a shape of a bird's beak. The oxidation process is preferably a thermal wet oxidation process used to form field oxide layers in isolation regions. The thickness of the silicon dioxide layers 208a, 208b is from about 2000 angstroms to about 9000 angstroms and the temperature is from about 950° C. to about 1100° C.

Figure 5:
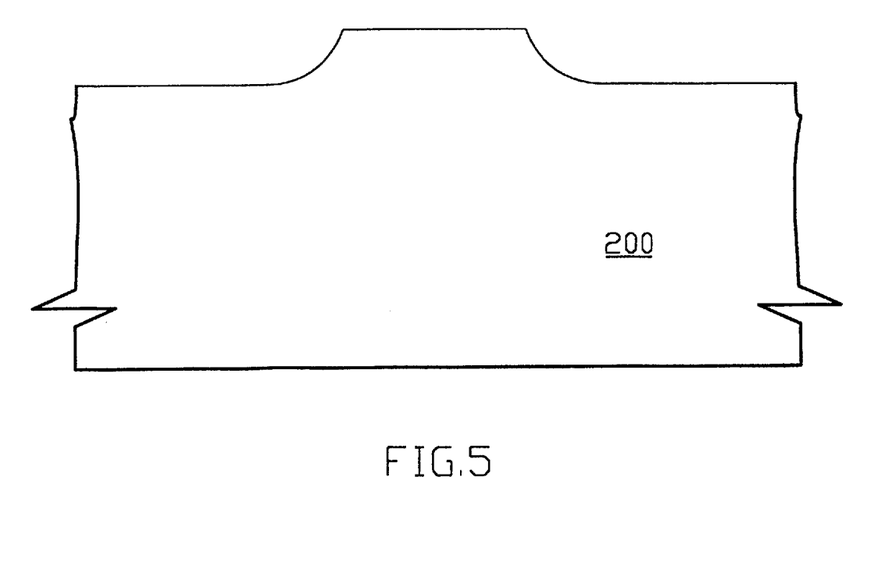
FIG. 5 shows a result of etching the first silicon nitride layer, the first pad oxide layer and the first silicon dioxide layer to expose the silicon substrate.

Referring now to FIG. 5, the silicon substrate 200 with a new shape of the surface is shown. This is the result of etching the silicon nitride layer 204a, the pad oxide layer 202a and the silicon dioxide layer 208a, 208b. The silicon nitride layer 204a can be removed using a conventional wet etching process. The etching solution is preferably a heated phosphoric acid solution. The pad oxide layer 202a and the silicon dioxide layers 208a, 208b can also be removed using a conventional wet etching process that is used to etch silicon dioxide. The etching solution is preferably a hydrofluoric acid (HF) solution.

Figure 6:
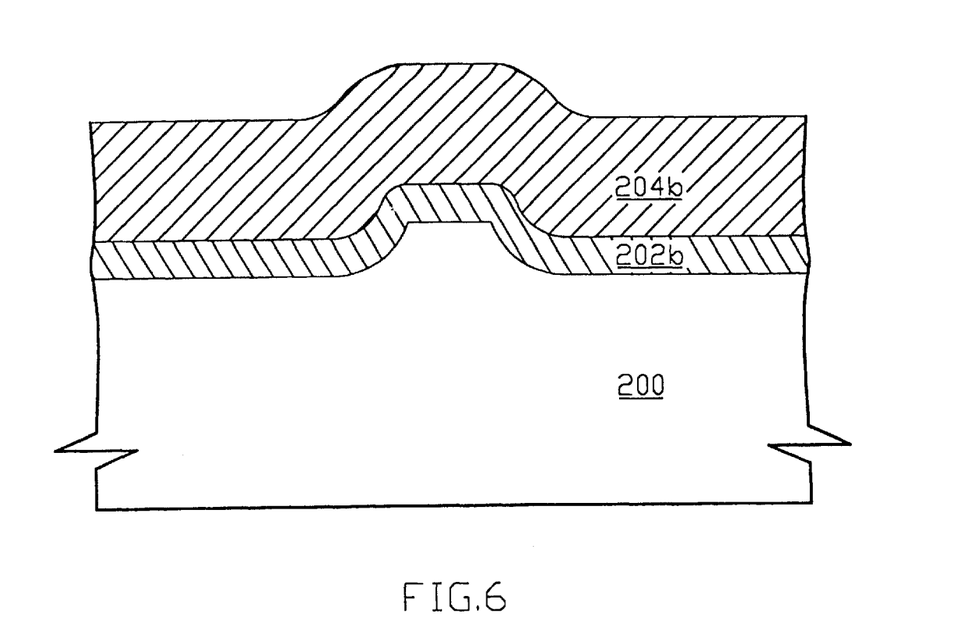
FIG. 6 shows a result of oxidizing the silicon substrate to form second pad oxide layer, and a second silicon nitride layer is formed thereon.

Referring now to FIG. 6, a pad oxide layer 202b is formed on the silicon substrate 200 shown in FIG. 5, and then a silicon nitride layer 204b is deposited on the pad oxide layer 202b. The pad oxide layer 202b is formed using a conventional thermal wet oxidation process. The thickness of the pad oxide layer 202b is about 100 to 500 angstroms, and the temperature of the thermal wet oxidation process is about 950° C. to about 1100° C. The silicon nitride layer 204b can be formed using a conventional chemical vapor deposition process, and preferably a low pressure chemical vapor deposition process. The thickness of the silicon nitride layer 204b is about 1000 to 2000 angstroms. The precursors of the low pressure chemical vapor deposition process are dichlorosilane ($SiCl_2H_2$), ammonia ($NH_3$) and the reacting temperature is from about 650° C. to about 800° C.

Figure 7:
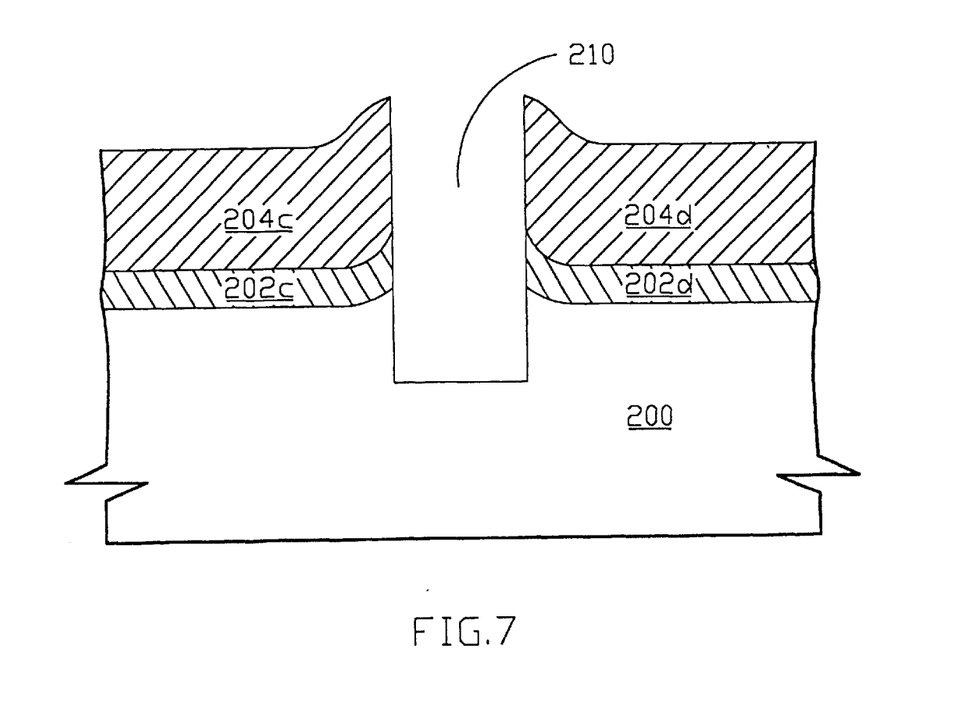
FIG. 7 shows a result of etching the second silicon nitride layer, the second pad oxide layer and the silicon substrate to form an isolation trench.

Referring now to FIG. 7, an isolation trench 210 is formed by patterning to etch the silicon nitride layer 204b, the pad oxide layer 202b and the silicon substrate 200 to a predetermined depth, and to define an isolation region of the silicon substrate 200. As the result of the etching process, silicon nitride layers 204c, 204d, pad oxide layers 202c, 202d are formed. The patterning process can be a conventional lithography process and the etching process can be a conventional dry etching process, for example, a reactive ion etching process. The reactive ion etching process preferably uses carbon tetrafluoride ($CF_4$) plasma and a radio frequency of 13.56 MHz.

Figure 8:
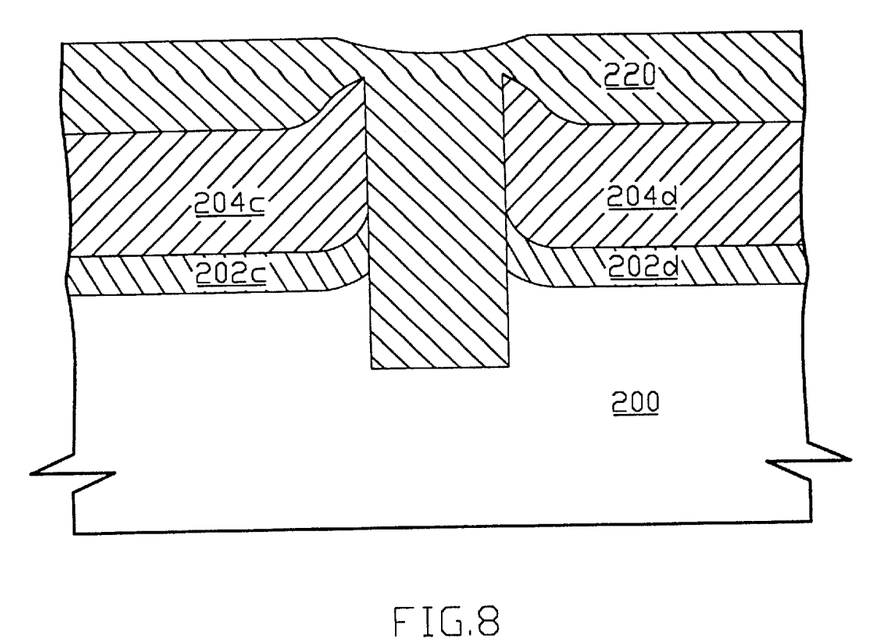
FIG. 8 shows a result of depositing a second silicon dioxide layer on the second silicon nitride layer and the isolation trench to fill the isolation trench.

Referring now to FIG. 8, a silicon dioxide layer 220 is deposited on the silicon nitride layers 204c, 204d and the isolation trench 210 to fill the isolation trench 210. The silicon dioxide 220 can be formed using a conventional chemical vapor deposition process, and preferably a low pressure chemical vapor deposition process. The precursors of the low pressure chemical vapor deposition process are dichlorosilane ($SiCl_2H_2$), nitrous oxide ($NO_2$) and the reacting temperature is from about 650° C. to about 850° C.

Figure 9:
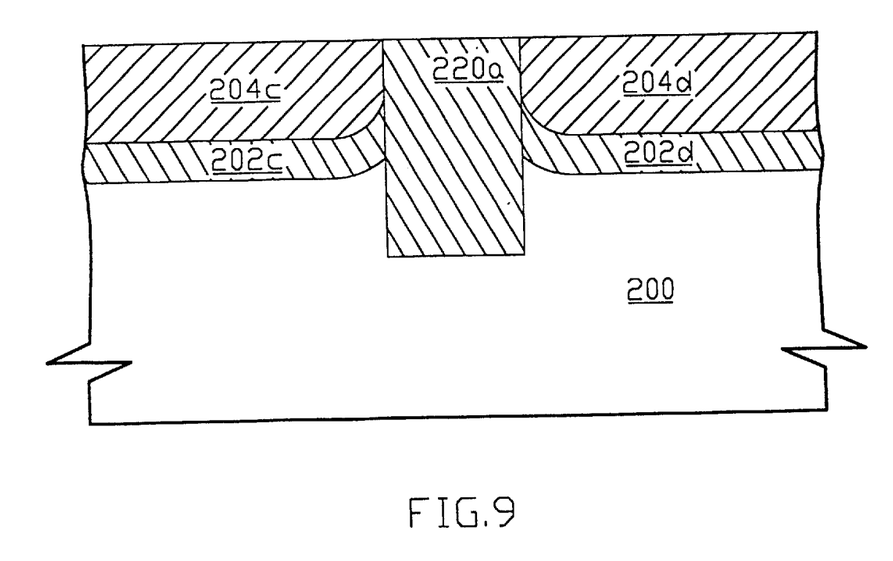
FIG. 9 shows a result of performing a chemical mechanical polish process on the second silicon dioxide layer to expose the second silicon nitride layer and to provide the second silicon nitride layer, the second silicon dioxide layer a planarized surface.

Referring now to FIG. 9, the portion of the silicon dioxide layer 220 above the silicon nitride layers 204c, 204d is removed to expose the silicon nitride layers 204c, 204d using a chemical mechanical polish process. Furthermore, a planarized surface of the silicon nitride layers 204c, 204d, a trench isolation 220a is then formed by using the chemical mechanical polish process.

Figure 10:
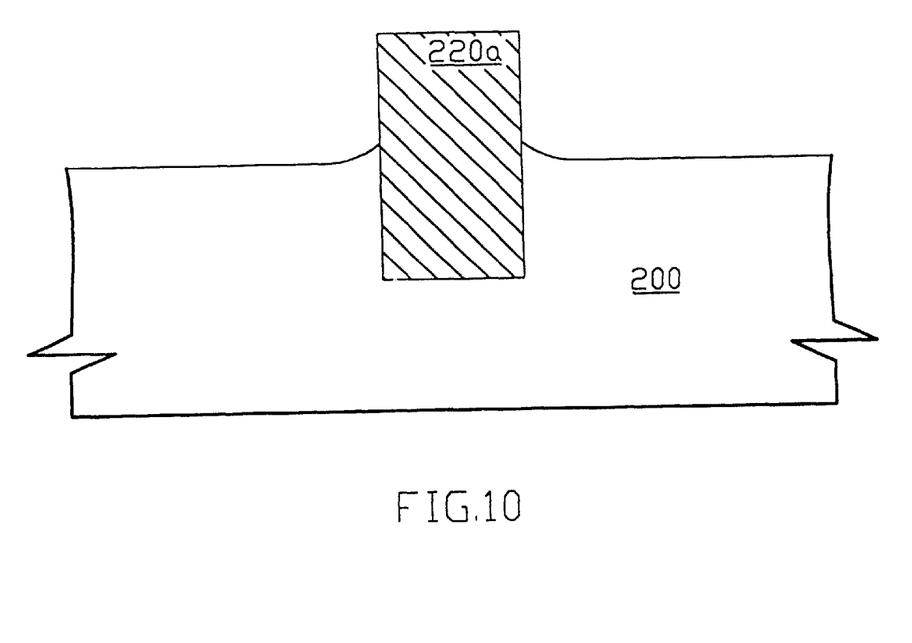
FIG. 10 show a result of etching the second silicon nitride layer and the second pad oxide layer to form the trench isolation of the invention.

Referring now to FIG. 10, the silicon nitride layers 204c, 204d and the pad oxide layers 202c, 202d are removed using conventional etching processes. The silicon nitride layer 204c, 204d are preferably etched using a wet etching process. The pad oxide layers 202c, 202d are preferably etched by using a wet etching process. The etching solution is preferably a heated phosphoric acid solution. Moreover, the pad oxide layers 202c, 202d are preferably etched using a wet etching process and the etching solution is preferably a hydrofluoric acid (HF) solution.

The invention uses a silicon nitride layer used as an anti-diffusion layer mask that defines an isolation region on a silicon substrate, and a thermal oxidation process that is performed on an active region to prevent the sharp corner of the interconnection between the surface of the diffusion layer and the trench isolation from being formed. This is done because the lateral oxidation of the active regions of the silicon substrate underneath the anti-diffusion layer mask provides an edge of the silicon dioxide layer a shape of a bird's beak. Then the silicon nitride layer and the silicon dioxide layer are removed, and a conventional manufacturing process of a trench isolation can be preformed on the silicon substrate. Therefore, the invention resolves the problem of the residual polysilicon shown in FIG. 1. Furthermore, the problem of short circuit of polysilicon gate electrodes can be avoided.

Other embodiments of the invention will appear to those skilled in the art from consideration of the specification and practice of the invention disclosed herein. It is intended that the specification and examples are to be considered as exemplary only, with a true scope and spirit of the invention being indicated by the following claims.

What is claimed is:

1. A method for manufacturing a trench isolation in a semiconductor device, said method comprising:
   providing a silicon substrate having a first pad oxide layer and a first silicon nitride layer, wherein said first silicon nitride layer is formed on said first pad oxide layer;
   transferring an isolation region pattern into said first pad oxide layer and said first silicon nitride layer to form an anti-diffusion layer mask and expose an active region of said silicon substrate;
   oxidizing said silicon substrate to form a first silicon dioxide layer;
   removing said first silicon nitride layer;
   removing said first pad oxide layer and said first silicon dioxide layer;
   oxidizing said silicon substrate to form a second pad oxide layer on said silicon substrate;
   depositing a second silicon nitride layer on said second pad oxide layer;
   transferring an active region pattern into said second silicon nitride layer, said second pad oxide layer and said silicon substrate to form an isolation trench in said silicon substrate;
   depositing a second silicon dioxide layer on said second silicon nitride layer and said isolation trench to fill said isolation trench;
   planarizing said second silicon dioxide layer to expose said second silicon nitride layer;
   removing said second silicon nitride layer; and
   removing said second pad oxide layer.

2. The method according to claim 1, wherein said first silicon nitride layer is etched by using a dry etching process.

3. The method according to claim 1, wherein said first pad oxide layer is etched by using a dry etching process.

4. The method according to claim 1, wherein said first silicon dioxide layer is formed by using a thermal oxidation process.

5. The method according to claim 1, wherein said first silicon nitride layer used as said anti-diffusion layer mask is etched by using a wet etching process.

6. The method according to claim 1, wherein said first silicon dioxide layer is etched by using a wet etching process.

7. The method according to claim 1, wherein said second pad oxide layer is formed by using a thermal oxidation process.

8. The method according to claim 1, wherein said second silicon nitride layer is deposited by using a low pressure chemical vapor deposition process.

9. The method according to claim 1, wherein said second silicon nitride layer is deposited by using a plasma enhanced chemical vapor deposition process.

10. The method according to claim 1, wherein said isolation trench is formed by using a dry etching process.

11. The method according to claim 1, wherein said second silicon dioxide layer is deposited by using a low pressure chemical vapor deposition process.

12. The method according to claim 1, wherein said second silicon dioxide layer is deposited by using a plasma enhanced chemical vapor deposition process.

13. The method according to claim 1, wherein said second silicon nitride layer is etched by using a wet etching process.

14. The method according to claim 1, wherein said second pad oxide layer is etched by using a wet etching process.

15. A method for manufacturing a trench isolation in a semiconductor device, said method comprising:
   providing a silicon substrate having a first pad oxide layer and a first silicon nitride layer, wherein said first silicon nitride layer is formed on said first pad oxide layer;
   transferring an isolation region pattern into said first pad oxide layer and said first silicon nitride layer by using a dry etching process to form an anti-diffusion layer mask and expose an active region of said silicon substrate;
   oxidizing said silicon substrate by using a thermal oxidation process to form a first silicon dioxide layer, wherein lateral oxidation on said active region of said silicon substrate underneath said first pad oxide layer, said first silicon nitride layer provides an edge of said first silicon dioxide layer a shape of a bird's beak;
   removing said first silicon nitride layer;
   removing said first pad oxide layer and said first silicon dioxide layer;
   oxidizing said silicon substrate to form a second pad oxide layer on said silicon substrate;
   depositing a second silicon nitride layer on said second pad oxide layer;
   transferring an active region pattern into said second silicon nitride layer, said second pad oxide layer and said silicon substrate to form an isolation trench in an isolation region of said silicon substrate;
   depositing a second silicon dioxide layer on said second silicon nitride layer and said isolation trench to fill said isolation trench;
   planarizing said second silicon dioxide layer to expose said second silicon nitride layer by using a chemical mechanical polishing process;
   removing said second silicon nitride layer; and
   removing said second pad oxide layer.

16. The method according to claim 15, wherein said first silicon nitride layer used as said anti-diffusion layer mask is etched by using a wet etching process.

17. The method according to claim 15, wherein said first silicon dioxide layer is etched by using a wet etching process.

18. The method according to claim 15, wherein said second pad oxide layer is formed by using a thermal oxidation process.

19. The method according to claim 15, wherein said second silicon nitride layer is deposited by using a low pressure chemical vapor deposition process.

20. The method according to claim 15, wherein said second silicon nitride layer is deposited by using a plasma enhanced chemical vapor deposition process.

21. The method according to claim 15, wherein said isolation trench is formed by using a dry etching process.

22. The method according to claim 15, wherein said second silicon dioxide layer is deposited by using a low pressure chemical vapor deposition process.

23. The method according to claim 15, wherein said second silicon dioxide layer is deposited by using a plasma enhanced chemical vapor deposition process.

24. The method according to claim 15, wherein said second silicon nitride layer is etched by using a wet etching process.

25. The method according to claim 15, wherein said second pad oxide layer is etch ed by using a wet etching process.

26. A method for manufacturing a trench isolation in a semiconductor device, said method comprising:

providing a silicon substrate having a first pad oxide layer and a first silicon nitride layer, wherein said first silicon nitride layer is formed on said first pad oxide layer;

transferring an isolation region pattern into said first pad oxide layer and said first silicon nitride layer by using a dry etching process to form an anti-diffusion layer mask and expose an active region of said silicon substrate;

oxidizing said silicon substrate by using a thermal oxidation process to form a first silicon dioxide layer, wherein lateral oxidation on said active region of said silicon substrate underneath said first pad oxide layer, said first silicon nitride layer provides an edge of said first silicon dioxide layer a shape of a bird's beak;

removing said first silicon nitride layer by using a wet etching process;

removing said first pad oxide layer and said first silicon dioxide layer by using a wet etching process;

oxidizing said silicon substrate by using a thermal oxidation process to form a second pad oxide layer on said silicon substrate;

depositing a second silicon nitride layer by using a low pressure chemical vapor deposition process on said second pad oxide layer;

transferring an active region pattern into said second silicon nitride layer, said second pad oxide layer and said silicon substrate by using a dry etching process to form an isolation trench in an isolation region of said silicon substrate;

depositing a second silicon dioxide layer on said second silicon nitride layer and said isolation trench by using a low pressure chemical vapor deposition process to fill said isolation trench;

planarizing said second silicon dioxide layer to expose said second silicon nitride layer by using a chemical mechanical polishing process;

removing said second silicon nitride layer; and removing said second pad oxide layer.

27. The method according to claim 26, wherein said second silicon nitride layer is etched by using a wet etching process.

28. The method according to claim 26, wherein said second pad oxide layer is etched by using a wet etching process.

* * * * *